United States Patent [19]
Liedenbaum et al.

[11] Patent Number: 5,333,144
[45] Date of Patent: Jul. 26, 1994

[54] DIODE LASER DEVICE HAVING A REFLECTING FEEDBACK ELEMENT, AND APPARATUS USING THE DEVICE

[75] Inventors: Coen T. H. F. Liedenbaum; Ronald R. Drenten; Michiel J. Jongerius, all of Eindhoven, Netherlands

[73] Assignee: U.S. Philips Corporation, New York, N.Y.

[21] Appl. No.: 996,214

[22] Filed: Dec. 23, 1992

[30] Foreign Application Priority Data

Dec. 30, 1991 [EP] European Pat. Off. ......... 91203427.9
Dec. 3, 1992 [EP] European Pat. Off. ......... 92203739.5

[51] Int. Cl.$^5$ ............................................. H01S 3/13
[52] U.S. Cl. .................................... 372/29; 372/20; 372/99; 372/108
[58] Field of Search ................ 372/9, 20, 29–32, 372/38, 43, 50, 96, 98–101, 108

[56] References Cited

U.S. PATENT DOCUMENTS

| 4,709,369 | 11/1987 | Howard | 372/38 |
| 4,918,679 | 4/1990 | Opheij et al. | 369/44 |
| 5,123,023 | 6/1992 | Santarelli et al. | 372/38 |
| 5,179,565 | 1/1993 | Tsuchiya et al. | 372/38 |

FOREIGN PATENT DOCUMENTS

0084871 8/1983 European Pat. Off.

Primary Examiner—John D. Lee
Attorney, Agent, or Firm—David R. Treacy

[57] ABSTRACT

An optical device (7) for use in optical write, read, inspection or measuring apparatuses comprising a diode laser (8) for generating a radiation beam (11) and an optical system (9) for concentrating and guiding the radiation beam. The diode laser is a pulsed laser and a feedback element is arranged in the radiation path at a specific distance (d) from the diode laser. By giving the element a suitable reflection coefficient, a stabilized radiation beam is obtained. The beam direction can be varied by rendering the wavelength adjustable and by making use of a dispersive element.

26 Claims, 6 Drawing Sheets

DIODE LASER DEVICE HAVING A REFLECTING FEEDBACK ELEMENT, AND APPARATUS USING THE DEVICE

CROSS-REFERENCE TO RELATED APPLICATIONS

This application is related to a concurrently-filed application by Coen Liedenbaum, Arnoldus Severens, Ronald Drenten, and Michiel Jongerius, Ser. No. 07/996,215, for Device in Which Electromagnetic Radiation is Raised in Frequency and Apparatus for Optically Scanning an Information Plane, Comprising Such a Device.

BACKGROUND OF THE INVENTION

The invention relates to an optical device comprising a diode laser for generating a radiation beam, and an optical system for concentrating and guiding the radiation beam.

The invention also relates to an apparatus for scanning an information plane, which apparatus comprises such a device.

An information planar structure or surface is herein understood to mean a plane comprising information which can be read optically, or such a plane in which information can be written optically. Such a plane is, for example the information plane of an optical record carrier, but also the surface of a document which is written with a laser printer or is read with a document scanner, as in a facsimile apparatus.

A device of the type described in the opening paragraph is known, for example from European Patent Application EP 0.084.871 which relates to an apparatus for reading an optical record carder. The diode lasers used in this apparatus are very sensitive to feedback. Due to reflection of the laser radiation from elements of the optical system, a portion of the radiation emitted by the diode laser may return to the active layer of the diode laser. A small quantity of radiation fed back, even if only of the order of 0.1% of the emitted radiation, may cause a variation of the laser radiation. Dependent on the quantity of radiation fed back, this may lead to an increase of the line width of the laser, wavelength variation in the output spectrum, or noise. These phenomena are generally undesirable. Moreover, the effects are generally not constant but dependent on the phase of the light returning to the laser; in other words, they are dependent on optical path length variations of the order of the laser wavelength, for example, due to displacements or vibrations of optical elements.

It is therefore attempted to avoid feedback in the laser as much as possible. However, practice has proved that, inter alia due to tolerances of the elements in the optical system, the feedback cannot be prevented to a sufficient extent, unless very stringent requirements are imposed on the optical elements so that the device will be too expensive for various uses.

It is proposed in European Patent Application 0.084.871 to increase the quantity of radiation fed back to the order of 1 to 10% of the radiation emitted by the diode laser in a device in which a diode laser emits radiation continuously. This measure is based on the recognition that the noise of the laser radiation caused by the feedback does not increase continuously with the quantity of radiation which has been fed back, but that there is a given level for this radiation at which the noise level is maximum and the quantity of noise decreases with a further increase of the feedback. However, in the device with the continuously emitting diode laser the intensity of the laser beam will decrease due to an increase of the feedback, which is particularly detrimental for, for example, a device for writing optical record carriers. Moreover, as a result of the feedback the output spectrum will shift in wavelength, which is very undesirable for uses in which the operation of a system is adjusted to a given wavelength band.

SUMMARY OF THE INVENTION

It is an object of the present invention to provide a device in which detrimental effects of the unwanted feedback are reduced considerably, while the laser beam has a sufficiently high intensity.

To this end, the optical device according to the invention is characterized in that the diode laser is a pulsed laser which supplies radiation pulses at a pulse duration p and a pulse period T and in that an at least partially reflecting feedback element is arranged in the radiation path of the radiation beam at approximately a distance d from the diode laser, which distance d satisfies the condition $$d = \frac{c}{2} \cdot nT - \frac{c}{2} \cdot \epsilon(p + \Delta p)$$

in which n is an integer, c is the light velocity in a medium traversed by the radiation beam, $\Delta p$ is the build-up time of pulse PL in the diode laser and $\epsilon$ is a real number which satisfies $0 < \epsilon < 1$ and increases or decreases within these limits at a decreasing or increasing energy $E(P_r)$, respectively, of a radiation pulse reflected by the feedback element so that the condition given by $$E(P_r) < E(PL_i)$$

is satisfied at the instant when the reflected radiation pulse enters the diode laser, $E(PL_i)$ being the radiation energy built up in the diode laser at the relevant instant.

At least a part of the radiation emitted by the laser is returned to the laser by the reflecting element. The reflection coefficient and the position of this element are chosen to be such that the radiation fed back by this element to the laser has such an intensity and arrives at the laser at such an instant that this radiation substantially completely defines the behaviour of the laser and that other, unwanted reflections by other elements of the device do not substantially have any effect on the behaviour of the laser.

The invention is based on the recognition that the behaviour of a pulsed diode laser is mainly determined by events occurring within the laser in the build-up time, in the time interval just before a new optical pulse is generated. By adapting the delay time of a reflected radiation pulse, the extra photons as a result of the feedback arrive in exactly such a time interval and mainly determine the behaviour of the laser. As a result, the diode laser can be controlled in a defined way by the deliberately provided feedback. The influence of other, unwanted feedbacks can be reduced by ensuring that the unwanted radiation pulses arrive in the diode laser at such instants as a result thereof, or, as a result of the deliberately provided feedback, have such a low intensity with respect to the feedback pulses that they do not influence the diode laser behaviour. The delay time is understood to mean the time required by a radiation pulse to cover the path from the exit face of the diode laser to the feedback element and back to the diode laser. The distance d is then the distance between the feedback element and the exit face of the diode laser. For stabilization, use may also be made of the radiation emitted from the rear face of the diode laser. The distance d is then the distance between this face and the feedback element.

Since the diode laser emits its radiation in pulses, this laser may yield a higher power without detrimentally influencing its lifetime.

The device according to the invention may be further characterized in that the feedback element is an element of the optical system.

By arranging the surface of an element which is already present in the optical system at the correct position and by giving this surface the correct reflection coefficient, an extra element may be dispensed with.

The partially reflecting feedback element may be adapted to the parameter of the diode laser which is to be influenced. For example, the optical device may be further characterized in that the feedback element is a wavelength-selective element.

With such an element such as, for example, a prism, a grating or an etalon, it can be ensured that the laser beam always has the same wavelength, independent of variations of, for example, the temperature of or the current through the diode laser. An etalon is understood to mean an element comprising two partially reflecting planes facing each other, arranged at a given distance from each other and enclosing some medium, for example air.

It is to be noted that a special diode laser configuration, referred to as a distributed Bragg reflector is known in which a grating is used for stabilizing the laser wavelength. However, the grating is integrated with the diode laser on one substrate. In view of the requirements imposed on the grating period, such a diode laser configuration is difficult to realise in given wavelength ranges of the diode laser radiation.

A further embodiment of the optical device according to the invention is characterized in that folding means for folding the radiation path are arranged between the diode laser and the feedback means.

The distance d between the diode laser and the feedback element required for the spectral stabilization of the laser beam can then be realised within a small volume so that the device may be compact.

The folding means may be constituted, for example by two facing reflecting surfaces between which the light beam propagates.

A preferred embodiment of the optical device according to the invention is characterized in that the folding means comprise a folding body of optically transparent material having at least two reflecting surfaces and being provided with an entrance window and an exit window, and in that one of the reflecting surfaces is provided with a third window for transmitting the diode laser radiation to and from the feedback The means for folding the light path preferably comprise a body formed in one piece. In this way the tolerances are only determined when this body is manufactured, rather than by the mutual positioning of the two reflecting surfaces, as is the case with two separate, facing surfaces.

The folding body may be made of glass which may have a relatively high refractive index, for example n=1.8. The geometrical pathlength can then be reduced by a factor of 1.8 with respect to the geometrical pathlength in air with n=1 so that the device will become even more compact.

The entrance window and the exit window may both be provided in the first surface of the folding body and coincide with each other. In this case the diode laser radiation which is not required for feedback and the radiation which is further required in the device are to be separated from each other by means of an extra element between the diode laser and the folding body. This element may be, for example a beam splitter.

Alternatively, the entrance window may be provided in the first reflecting surface and the exit window may be provided in the second reflecting surface. In that case the diode laser radiation not required for feedback need not be separated by means of an extra element, but the exit window of the folding body may be formed as a partially transmissive reflector.

The optical device according to the invention is preferably characterized in that the feedback means are integrated in the third window.

Due to this combination of two elements in one, the number of components is reduced so that the device may become even more compact.

A possible embodiment of the optical device according to the invention is characterized in that each reflecting surface is provided with a layer having a high reflection coefficient.

Due to the presence of a layer having a high reflection, intensity loss in the folded light path is limited.

A possible embodiment of the optical device according to the invention is characterized in that the folding body is a plane-parallel plate in which the first reflecting surface and the second reflecting surface are located opposite and parallel to each other.

An alternative embodiment of the optical device according to the invention, in which no high-reflection layers are necessary on the folding body, is characterized in that the folding body is present in a medium having a refractive index which is smaller than that of the body material, in that the folding body has at least two surfaces which totally and internally reflect radiation incident thereon and in that the radiation is reflected at least once by each one of said two surfaces when it traverses a coplanar radiation path in the folding body.

The optical device may be further characterized in that an optical prism is arranged on the entrance window and on the exit window, the surface of said prism, through which a radiation beam enters and leaves the prism, being transverse to the chief ray of the beam.

The optical prisms prevent false reflections from occurring when the radiation beam enters and leaves the folding body.

A further embodiment of the optical device according to the invention is characterized in that one of the reflecting surfaces is provided with a fourth window on which a retro-directive element is arranged by which the radiation, after having traversed a first radiation path extending to the reflecting surfaces via a number of reflections, is captured in a first plane within the folding body and is reflected parallel to itself, and re-enters the body so as to traverse at least a second radiation path extending to the reflecting surfaces via a number of reflections in a plane parallel to the first plane.

The retro-directive element ensures that an incident radiation beam, which is propagated through the body along a first radiation path in a first plane perpendicular to the first and second reflecting surfaces, is converted into a reflected radiation beam which is propagated through the body in a second radiation path in a second plane parallel to the first plane. In this way the third dimension of the body is also utilized for folding the radiation path. The retro-directive element may be, for example a prism having an apex angle of 90°, arranged on the folding body. The prism may alternatively be ground directly into the plane-parallel plate.

Such a geometry may be repeated several times so that more than two parallel faces can be utilized.

The optical device is preferably further characterized in that the feedback element is a grating.

A grating has a relatively high wavelength-resolving power.

A further embodiment of the optical device according to the invention is characterized in that the grating extends at a small angle different from 0° to the third window.

Since the wavelength-resolving power of a grating is also determined by the diameter of the beam which is incident thereon, this resolving power can be improved by causing the beam to be incident on the grating at a larger angle so that the diameter of the radiation spot on the grating is increased.

A further embodiment of the optical device according to the invention is characterized in that for the purpose of changing the wavelength of the radiation reflected towards the diode laser, the folding body is rotatably arranged at a small angle with respect to the radiation beam supplied by the diode laser.

A given wavelength can be selected by orienting the body and consequently the wavelength-selective element integrated therein in a different way with respect to an incident radiation beam.

For many applications of the device it is not only necessary but also sufficient that it is insensitive to feedback and that the wavelength of the radiation supplied by the device is stabilized at one value.

However, in accordance with a further aspect of the invention the device is further characterized in that electronic control means are provided for adjusting the wavelength of the radiation supplied by the combination of diode laser and feedback element at different discrete values.

This renders novel applications of the device possible. For one of these novel applications the device is further characterized in that a dispersive element is arranged behind the feedback element.

Since the angle at which a radiation beam is deflected by a dispersive element such as a grating or a prism is dependent on the wavelength of this beam, the direction of the beam emerging from this device can be varied discretely. The possible number of directions of the beam is determined by the wavelength-separating power of the dispersive element; in the case of a grating, the number of grating periods covered by the beam.

As compared with conventional devices supplying a scanning radiation beam and using mechanical means such as a rotating mirror polygon for deflecting the beam, the device according to the invention has the advantage that the direction of the beam can be varied very rapidly due to the electronic control.

It is to be noted that a device for supplying a laser beam whose direction is adjustable is described in U.S. Pat. No. 4,918,679, which device comprises a grating and in which a laser beam having an adjustable wavelength is generated. To this end the known device is provided with a controllable extra resonance space behind the diode laser.

In the device according to the present invention use is made of a feedback element for adjusting the laser wavelength, so that the wavelength at which the laser action is stabilized can be varied relatively rapidly.

The dispersive element may be a transmissive element or a reflecting element.

A first embodiment of the device according to the invention, supplying a beam which can be deflected, is characterized in that the feedback element is constituted by an optical waveguide with a grating integrated therein, which grating has a period varying in the direction of propagation of the radiation beam, and in that the electronic control means are constituted by a frequency-adjustable, periodically modulated current source for the diode laser.

Now, the feedback element is no longer arranged at one given distance from the diode laser, but extends over a given range in the axial direction, i.e. the direction of propagation of the radiation beam. In this way the diode laser radiation can be reflected from different axial positions. Since the above-formulated delay time condition must always be satisfied, the distance d will vary when varying the pulse repetition frequency, hence the pulse period T in the delay time condition. By adjusting the pulse repetition frequency at a different value, it is achieved that the relevant part of the diode laser beam is reflected by another part of the feedback grating. Since the period varies across the grating, the wavelength of the reflected radiation entering the diode laser and hence the wavelength of the diode laser radiation can be varied by varying the pulse repetition frequency.

The optical waveguide may be an optical fibre or an optical planar waveguide.

A second embodiment of the optical device according to the invention, supplying a beam which can be deflected, is characterized in that an exit face of the diode laser has a low reflection coefficient and in that the feedback element is constituted by a partially transparent reflector arranged at the distance d from the exit face of the diode laser and a component which is arranged between said reflector and the diode laser and has an adjustable transmission coefficient, and in that the electronic control means are constituted by electrodes on the component and an adjustable voltage source whose output terminals are connected to the electrodes.

The exit face of the diode laser may be the face opposite the optical system, the front face but also the rear face.

This embodiment is based on the recognition that the radiation of a diode laser whose exit face has a low reflection coefficient has a higher wavelength than that of a diode laser whose exit face has a larger reflection coefficient. This is probably the result of the difference in charge carrier density during the laser action which is larger in the first-mentioned diode laser. By giving the exit face of the diode laser a low reflection coefficient, for example, by providing an antireflection coating on this face and by arranging an external reflector whose reflection coefficient is adjustable behind this face, the charge carrier density in the diode laser and hence the wavelength of the diode laser can be adjusted and varied.

The second embodiment of the device according to the invention, supplying a beam which can be deflected, may be further characterized in that the component having the adjustable transmission coefficient is constituted by an electro-optical element succeeded by a polarization analyzer.

By varying the voltage across the electrodes of the electro-optical dement, the refractive index of this element can be varied. As a result, the state of polarization of radiation passing through the element also varies. The polarization analyzer converts the change of the state of polarization into an intensity variation. The electro-optical element may be constituted by a birefringent crystal.

However, this embodiment is preferably characterized in that the element is a liquid crystalline material. Such an element has the advantage that it is inexpensive and can be driven at low voltages.

Alternatively, the device supplying a beam which can be deflected may be characterized in that the component having the adjustable transmission coefficient comprises an acousto-optical element succeeded by a polarization analyzer.

As compared with an electro-optical modulator, considerably less voltage is required for driving an acousto-optical modulator.

A third embodiment of the device according to the invention, supplying a beam which can be deflected, is characterized in that the component having the adjustable transmission coefficient is constituted by a planar interferometer, at least one branch of which incorporates an optical phase shifter.

In the planar interferometer the radiation beam entering via an entrance waveguide is split into two subbeams which propagate in separate intermediate waveguides so as to be combined again in an exit waveguide. In a part of one of the intermediate waveguides the refractive index may be varied via, for example, an electro-optical effect. Hence the phase of the beam through this waveguide varies so that the intensity of the exit beam also varies.

A further embodiment of the device according to the invention is characterized in that an etalon is arranged in the radiation path in addition to the component having the adjustable transmission coefficient.

In this way the pulsed diode laser will behave as a monomode laser.

An embodiment of the device according to the invention is characterized in that the diode laser is a self-pulsing diode laser.

Any pulsing diode laser is suitable for such applications. Self-pulsing diode lasers are known per se, inter alia from British Patent Application GB 2 221 094.

The optical device comprising a diode laser whose wavelength is stabilized may be used to great advantage in an apparatus for scanning an information plane, which apparatus comprises an optical device as described hereinbefore for forming a scanning spot in the information plane. This apparatus is characterized in that with the exception of the distance between the feedback element and the diode laser, the distances of all optical elements of the optical device are unequal to said distance d.

The optical device according to the invention, supplying a beam which can be deflected, can be used to great advantage in an apparatus for scanning a tape-shaped optical record carrier in tracks, which apparatus comprises means for scanning the record carrier in a direction transverse to the tape run direction. This apparatus is characterized in that the scanning means are constituted by an optical device as described hereinbefore, the direction of the tracks extending at an angle to the longitudinal direction of the tape. The apparatus is provided with tape drive means for longitudinally moving the tape during scanning, and beam deflection means for moving the scanning spot in the track direction, which beam deflection means are constituted by the components specified above.

Since the wavelength variation in the beam from the diode laser according to the invention is realised electronically, the velocity at which the tracks are scanned may be considerably higher than in the case where currently available mechanical means such as a rotating minor polygon are used for deflecting the beam. Moreover, considerably fewer vibrations occur in the novel beam deflection means than in a mechanical beam deflection means.

The invention will now be described in greater detail by way of example with reference to the accompanying drawings.

DESCRIPTION OF THE PREFERRED EMBODIMENT

Figure 1:
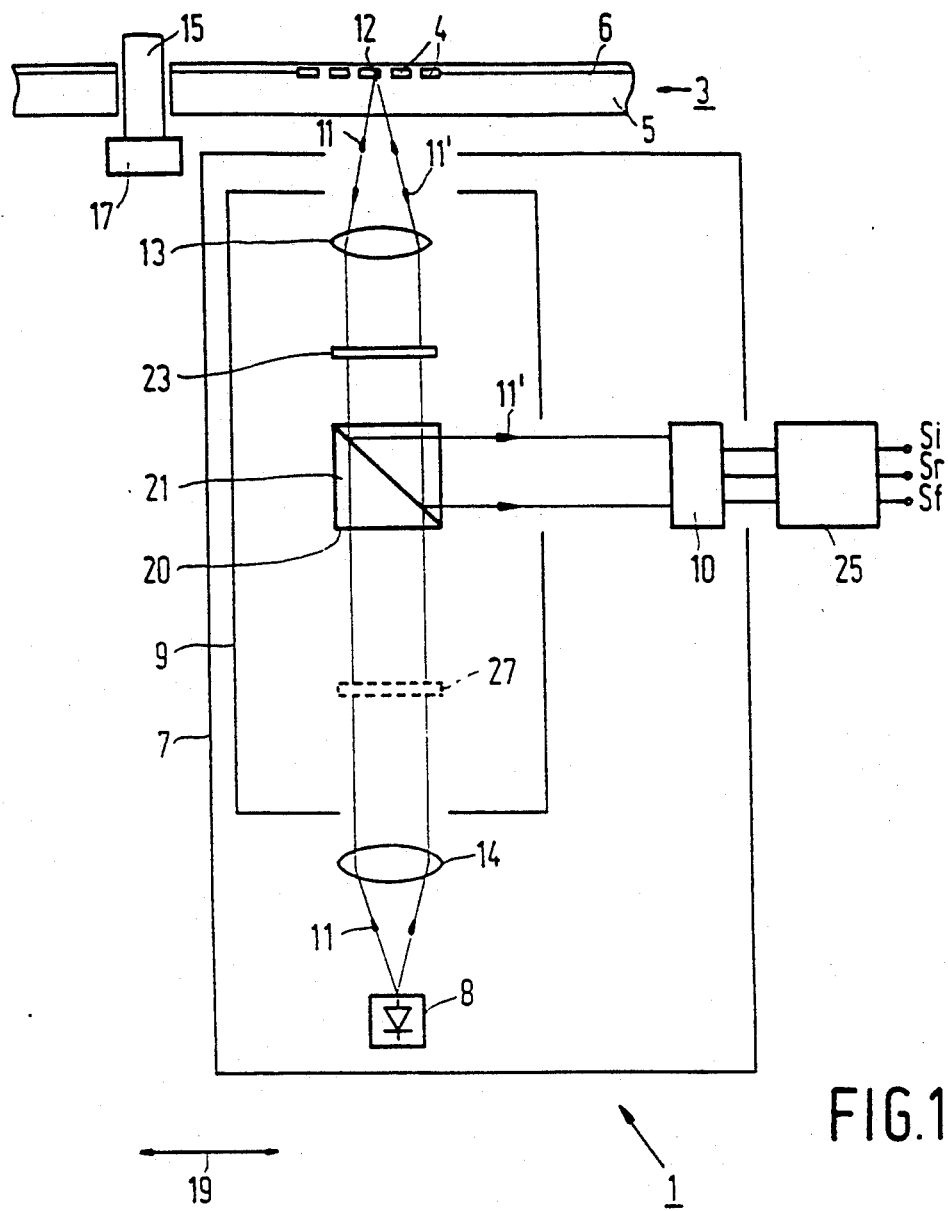
FIG. 1 shows diagrammatically an embodiment of an apparatus for optically scanning a record carrier, comprising an optical device according to the invention.

FIG. 1 shows diagrammatically a reading apparatus 1 for scanning an optical record carrier 3. Scanning is understood to mean scanning during writing as well as scanning during reading of the record carrier. The apparatus 1 may be, for example an optical disc player and the record carrier 3 may be, for example an optical audio disc which is known as compact disc. The disc-shaped optical record carrier 3 partly shown in a radial cross-section comprises a transparent substrate 5 and a reflecting information layer 6. This layer 6 comprises a large number of information areas (not shown) which are optically distinguished from their surroundings. The information areas are arranged in a large number of tracks 4, for example quasi-concentric tracks which jointly constitute a spiral track.

The reading apparatus 1 comprises an optical device 7 which is provided with a diode laser 8, an optical system 9 and a radiation-sensitive detection system 10. The diverging beam 11 emitted by the diode laser 8 is converted, for example, by a collimator lens 14 into a parallel beam and subsequently focused by an objective system 13 shown diagrammatically by means of a single lens element to a read spot 12 in the plane of the information layer 6 which reflects the beam. When the record carrier 3 is rotated by means of a shaft 15 which is driven by a motor 17, an information track is scanned. By moving the record carrier 3 and the device 7 with respect to each other in the direction denoted by the arrow 19, the entire information plane can be scanned.

During scanning the reflected beam 11' is modulated in intensity in accordance with the information stored in the succession of information areas. In order to separate the reflected beam 11' from the projected beam 11, the device 7 may be provided with a partially transparent minor which reflects a part of the reflected and modulated beam 11' towards the radiation-sensitive detection system 10. However, the combination of a polarization-sensitive beam splitter 21 and a λ/4 plate 23 as shown in FIG. 1 is preferably used. It is then ensured that the laser beam 11 has such a direction of polarization that this beam is completely passed by the beam splitter 21. On its path to the record carrier 3, this beam traverses the λ/4 plate 23 a first time and after reflection by the record carder it traverses this λ/4 plate a second time so that its direction of polarization is rotated through 90° before it enters the beam splitter 21 again. Consequently, the beam 11' is completely reflected towards the detection system 10.

The detection system 10 comprises more than one detection element and its output signals are applied to an electronic processing unit 25 in which the detector signals are processed to an information signal $S_i$ which represents the information which has been read, a servosignal $S_r$ for keeping the read spot centred on the track to be read and a servosignal $S_f$ for keeping the read beam focused on the information layer.

For further details of the read apparatus, reference is made to the article "Het systeem "Compact Disc Digital Audio" by M. G. Carasso, J. B. H. Peek and J. P. Sinjou in Philips Technisch Tijdschrift 40, 267–272, 1981/82, no. 9.

Even when a polarization-sensitive beam splitter and a λ/4 plate are used, radiation may still return to the diode laser and enter the laser resonance cavity. This radiation affects the radiation emitted by the diode laser. The feedback may be caused by, for example, reflection on the front face 20 of the beam splitter 21 or by birefringence of the substrate 5 of the record carrier 3 so that the direction of polarization of the beam incident on the beam splitter 21 and reflected by the information plane is not rotated through exactly 90°. Due to all kinds of vibrations which may occur in the read apparatus, the phase of the radiation which has been fed back will exhibit variations so that the radiation emitted by the laser has a noise component. The frequency of this noise is such that particularly the servosignals $S_r$ and $S_f$ are affected so that problems may arise during tracking and focusing. Furthermore, the feedback may give rise to an increase of the wavelength band of the laser beam and to an offset of the wavelength of this beam, dependent on the quantity of radiation which has been fed back. A drawback of an increase of the wavelength band is the occurrence of dispersion in the optical system. Since the optical system is a monochromatic system, deviations in the radiation spot 12 occur.

To prevent the detrimental influences of said feedback, use is made according to the invention of a pulsed laser beam and a feedback element 27 having a given reflection coefficient is arranged at a defined location in the device. It is ensured that the part, reflected by the element 27, of a radiation pulse emitted by the diode laser arrives at the laser again at a suitable intensity and within the build-up time of a subsequent radiation pulse which is being generated. It has been found that it is exactly within this build-up time that the process of stimulated emission occurring within the laser is maximally sensitive to photons which are supplied externally, so that these photons substantially completely determine the behaviour of the diode laser.

Figure 2:
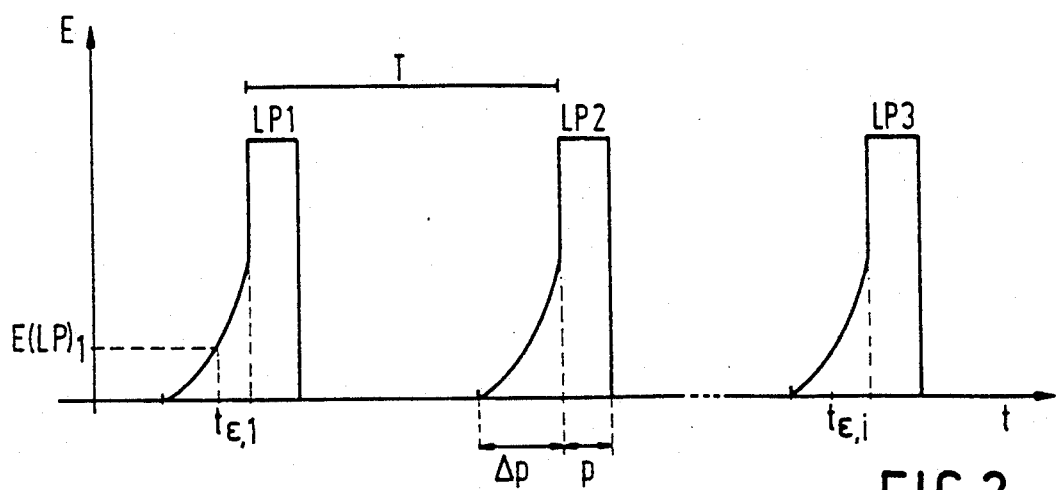
FIG. 2 shows a pulse series emitted by the diode laser.

With reference to FIG. 2 showing a number of pulses $LP_i$ of the laser pulse series, with $i = 1, 2, \ldots, n$ the delay time condition for a reflected laser pulse portion $LP_{r,i}$ can be determined. It has been assumed that the pulse duration of the emitted laser pulse is p and the period of the series is T. In determining the extent to which a reflected pulse $LP_{r,i}$ can influence a pulse $LP_i$ emitted by the diode laser, the instant when, in combination with the quantity with which, the reflected radiation energy reaches the diode laser is of great importance. To this end the delay time $R_t$ of the reflected pulse is to fall within two limits.

The first limit value is given by:

$$R_t = T$$

while the second limit is given by $$R_t = T - p - \Delta p$$

Since, in principle, it is aim possible that a reflected laser pulse $LP_{r,1}$ does not drive the next laser pulse $LP_2$ but the second next pulse $LP_3$ or one of the subsequent pulses $LP_i$, the above-mentioned limits can be generalized to:

$$R_t = nT$$

$$R_t = nT - p - \Delta p$$

with n being an integer.

The condition which the radiation energy of the reflected pulse must satisfy is:

$$E(P_r) > E(LP_i)$$

at an instant $t_{\epsilon,i}$ within the build-up time $\Delta p$ of the i-th pulse, at which instant the reflected pulse enters the laser.

This means that at the instant $t_{\epsilon,i}$ the radiation energy of the reflected pulse must be larger than the radiation energy built up at that instant in the laser for the next pulse (i-th pulse) to be emitted by the diode laser.

If the upper limit $R_t = n.T$ were satisfied, the trailing edge of the reflected pulse would coincide with the instant when the next pulse to be emitted is completely built up so that the reflected pulse no longer has any influence on the pulse to be emitted.

If the lower limit $R_l = nT - p - \Delta p$ were satisfied, the leading edge of the reflected pulse would coincide with the instant when the build-up of a new pulse has not yet started. Said limits are not absolute limits. Under circumstances some effect may still occur when these limits are slightly exceeded.

On the other hand, the delay time, i.e. the time required by a radiation pulse $LP_i$ to cover the path from the exit face of the diode laser and back to the diode laser, is given by $2d/c$ in which d is the distance between the diode laser 8 and the feedback element 27 and c is the speed of propagation of the light in the medium traversed by the radiation. In combination with the two limiting conditions, this yields the following delay time condition:

$$nT - p - \Delta p < \frac{2d}{c} < nT$$

so that the distance d is thus given by:

$$d = \frac{c}{2} \cdot nT - \frac{c}{2} \cdot \epsilon(p + \Delta p)$$

in which $\epsilon$ is a number larger than zero and smaller than one whose value is determined by the energy of the reflected pulse. If this energy is relatively large, the reflected pulse may arrive at a later instant within the build-up time so that $\epsilon$ is then closer to zero than to one. If the energy of the reflected pulse is lower, this pulse should arrive at an earlier instant within the build-up time so that $\epsilon$ is then closer to one than to zero. $\epsilon$ is therefore inversely proportional to the reflected pulse energy.

By arranging a feedback element 27 (FIG. 1) having a suitable reflection coefficient at a distance d from the diode laser and by ensuring that all other elements which can reflect radiation are arranged at a distance which does not satisfy the above-mentioned general condition, it is achieved that the behaviour of the diode laser, and hence the parameters and quality of the laser beam, are substantially only determined and maintained constant by the feedback via the first-mentioned element 27.

By suitable choice of the nature of the feedback element 27, a given parameter of the laser beam can be adjusted. The feedback element may be, for example a wavelength-selective element such as, for example a prism, a grating or an etalon. In this way the wavelength of the beam can be adjusted and maintained. Feedback can be realised both at the rear mirror and at the front mirror of the diode laser.

The feedback element 27 is shown by means of a broken line in FIG. 1 because, instead of using a separate feedback element, the invention may also be realised by giving the surface of an element already present in the device 7, for example, the surface 20 of the beam splitter 21 a suitable reflection coefficient and by ensuring that this surface 20 is situated at the above-mentioned distance d from the diode laser 8.

A condition for the choice of the feedback element 27 is that the beam 11 from the diode laser 8 enters the diode laser again after reflection by the feedback element.

If the beam 11 is converted into a parallel beam by means of a collimator lens 14, the feedback element 27 may be implemented as a (plane-parallel) plate because the collimator lens 14 focuses again on the diode laser 8.

If no use is made of the collimator lens 14, the feedback element 27 should have a curved surface in order to convert the diverging beam 11 into a beam which can enter the diode laser.

In practice the distance d between the diode laser and the feedback element, which distance is required to obtain spectral stabilization of the diode laser, may be relatively long, which is a drawback due to the desired compactness of the optical device. For example, for a pulse period p of 1 ns, a distance d of approximately 150 mm is required.

In accordance with a further aspect of the present invention the light path between the diode laser 8 and the feedback element 27 is folded. To this end the device may comprise, for example two facing reflectors between which the radiation beam is reflected a number of times. However, due to the stability, one body 120 of optically transparent material, for example a glass body is preferably used, in which two facing surfaces are reflecting so that a radiation beam entering the body is reflected many times. The tolerances are then determined during manufacture of the body. The folding body may not only be made of glass but also of other optically transparent materials having a sufficiently high refractive index, such as transparent synthetic material.

Figure 12A:
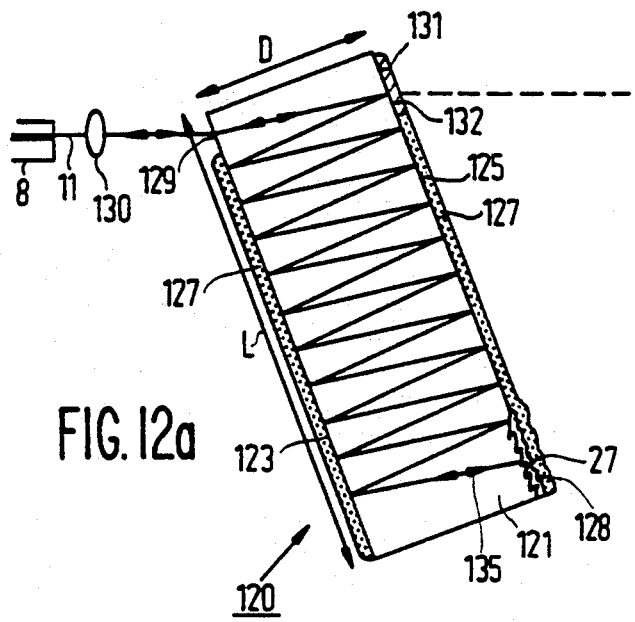

There may be different embodiments of such a folding body 120. A first embodiment is shown in FIG. 12a and comprises a plane-parallel plate 121, of which a first surface 123 and a second surface 125, which surfaces are located opposite each other, are provided with a reflection layer 127 having a high reflection. The first surface 123 further has an entrance window 129 and the second surface 125 has an exit window 131. A radiation beam 11 emitted by the diode laser 8 enters the plane-parallel plate 121 through the entrance window 129, for example via a collimator lens 130 and, since the beam is incident on the surfaces 123 and 125 at a small angle, it is reflected many times by these surfaces. The beam then reaches a wavelength-selective reflecting element 27 which is arranged in or behind a third window 128 in one of the surfaces. Subsequently, the beam traverses the plate in the reverse direction so as to leave it via the window 129 on its way to the diode laser.

The exit window 131 may be used for coupling the diode laser radiation which is not required for feedback out of the folding body. To this end the window 131 is preferably provided with a layer 132 functioning, for example as a partially transmissive beam splitting mirror.

The wavelength-selective feedback element 27 may be a separate component. However, this element is preferably integrated with the plane-parallel plate, i.e. it is arranged at the location of the window 128. This element may be, for example a prism. The prism may be arranged on the window or formed by a recess in the window. A grating 27 as shown in FIG. 12a is, however, preferred because of its relatively high wavelength-resolving power.

A grating may be integrated in the glass body in different manners. For example, the grating may be directly etched in a glass folding body or arranged as a separate component on the folding body. Another possibility is to provide a thin synthetic material layer on the folding body in which subsequently the grating is provided by means of a replica technique.

Due to folding, a radiation path having a length of, for example 130 mm in air for a radiation beam with a diameter of 3 mm can be accommodated in a glass plate having a thickness D of 8 mm and a length L of 13 ram, if the glass has a refractive index of 1.8.

Figure 13A:
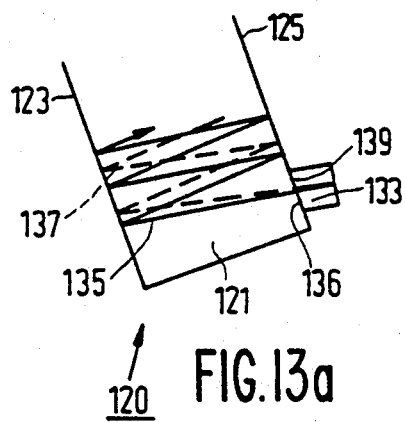
FIGS. 13a and 13b show in a plan view and in a side elevation, respectively, a part of a second embodiment of an optically transparent folding body for folding the light path in three dimensions in an optical device according to the invention.
Figure 13B:
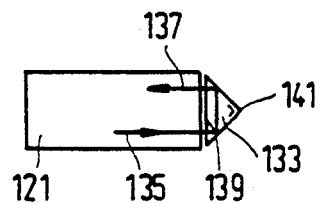

Folding may alternatively be effected three-dimensionally instead of two-dimensionally. To this end a retro-directive element 133 may be arranged on a fourth window 136 at the end of a first light path 135 on the glass body as shown in FIG. 22. After the radiation beam has traversed the first light path 135, which is located in a first plane perpendicular to the reflecting surfaces of the glass body, it is first reflected in the direction perpendicular to the plane of the drawing and subsequently reflected in a direction parallel to the direction of incidence on the element 133 so that the beam is passed into the plane-parallel plate 121 again so as to traverse a second light path 137 located in a second plane parallel to the first plane. In this way the folded light paths 135, 137 and possibly further light paths are stacked and consequently a folding body having a shorter length L can be used for realising a light path having a total length d which is required for spectral stabilization. This embodiment is shown in FIG. 13. FIG. 13a is a plan view and FIG. 13b is a side elevation.

A very suitable example of a retro-directive element 133 is a prism having an apex angle of 90°. The top rib of this prism is perpendicular to the chief ray of the beam. The prism has been ground in such a way that the base face 139 located opposite the top rib is parallel to the surface 125 so that there are no reflection losses.

Figure 14:
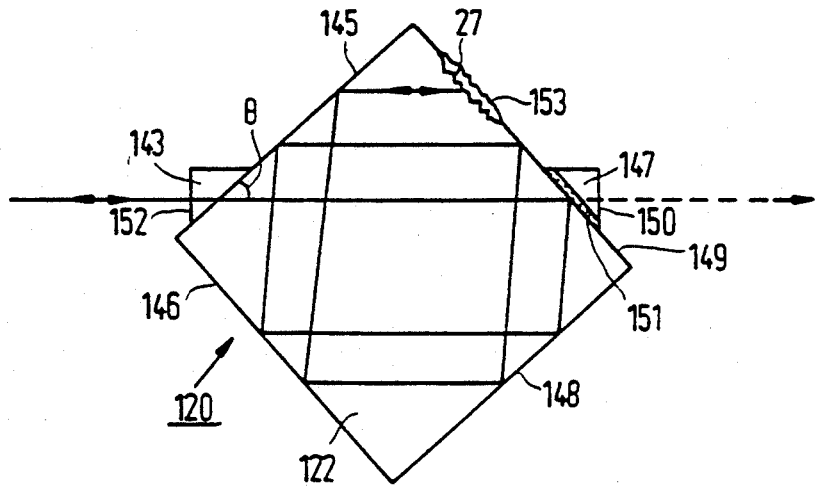
FIG. 14 shows a third embodiment of an optically transparent body in the form of a bar for folding the light path in an optical device according to the invention.

In another possible embodiment the folding body 120 according to the invention is formed as an optically transparant body 122 having a rectangular or square cross-section as is shown in FIG. 14. In this embodiment the surfaces 145, 146, 148, 149 are oriented with respect to the incident radiation beam in such a way that there is total internal reflection of the beam on each surface. In the embodiment of FIG. 14 this is effected twice for each surface before the beam reaches the feedback element 27. After reflection by this element, the beam traverses the same radiation path in the reverse direction and leaves the folding body via the surface 145 on its way to the diode laser.

The diode laser radiation which is not required for feedback leaves the folding body 122 via the surface 149. At the position where this is realised a layer 151 is provided, which layer functions as a partially transmissive beam splitting minor. Moreover, a prism 147 is preferably provided at said position and its surface 150 is perpendicular to the chief ray of the beam. A similar prism 143 with a perpendicular surface 152 is also preferably arranged on the surface 145 at the location where the diode laser beam enters the folding body. Both prisms may be made of, for example the same material as the glass body. In this embodiment and in the embodiment including the plane-parallel plate, the feedback element 27 may be a prism, a grating or an etalon which is arranged in or behind the window 153 in the glass body. A grating is, however, preferred because of its relatively high wavelength-resolving power.

In the same way as is shown in FIGS. 13a and 13b for the plane-parallel plate, the folding body of FIG. 14 may comprise a plurality of folded light paths in parallel planes within the glass body which are stacked by means of a retro-directive element 133 so as to realise folding in three dimensions.

Both embodiments 121, 122 of the folding body may alternatively be implemented in such a way that the entrance window and the exit window are located in the same surface 123 or 145 and coincide. In that case the diode laser radiation not required for feedback is to be coupled out by means of an additional element, for example a partially transmissive beam splitter between the diode laser and the folding body for further use in the device.

Figure 12B:
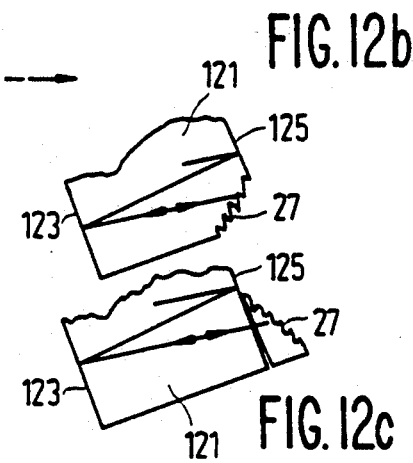
Figure 12C:

In each one of said embodiments of the folding body with a grating as a feedback element it is possible to arrange the grating at an acute angle with respect to the surface 125 or 149, as is shown for a grating in FIGS. 12b and 12c for a folding body in the form of a plane-parallel plate. In fact, the wavelength-resolving power is dependent on the number of grating periods falling within the radiation beam and hence on the diameter of this radiation beam. By tilting the grating with respect to the surface of the glass body, a larger surface of the grating is covered by the same radiation beam and consequently a larger wavelength-resolving power can be achieved.

In each embodiment of the glass body 121,122, and both for a grating and an etalon and for a prism as a feedback element, the body can be arranged in the optical device I to rotate with respect to the incident beam 11 so that the wavelength to be reflected can be changed.

The invention may also be used in an apparatus for reading a radiation-transmissive record carrier. The optical device of such an apparatus differs from that shown in FIG. 1 in that the detection system is situated at a different side of the record carrier than the radiation source.

The invention can be used to great advantage in an apparatus for optically writing a record carrier. The radiation source in such an apparatus should supply a larger power than that in a read apparatus. The larger power can be obtained by providing the front minor of the diode laser with an antireflection coating. As a result, however, the diode laser will be extra sensitive to feedback. Consequently, the use of the invention in a write apparatus has a still greater effect than in a read apparatus. The optical device of the write apparatus may differ from that shown in FIG. 1 in that the path of the laser beam incorporates a modulator for modulating the beam intensity in conformity with the information to be written. This modulation is preferably realised by means of modulation of the amplitude of the electric current through the diode laser.

In the embodiments described hereinbefore the diode laser is stabilized at a fixed wavelength. Instead of selecting a single mode it may, however, be desirable to have an adjustable wavelength in certain applications. This provides, for example, the possibility of deflecting the radiation beam in accordance with the principle described in U.S. Pat. No. 4,918,679. By arranging a dispersive element in the radiation path subsequent to the feedback element so as to vary the wavelength of the beam, a practical and attractive embodiment of this principle is obtained.

The dispersive element may be a transmission element or a reflection element.

The wavelength variation of the diode laser radiation desired for the beam deflection may be realised in different manners in accordance with the invention by making use of the feedback element which is already present for stabilizing the laser wavelength.

Figure 3:
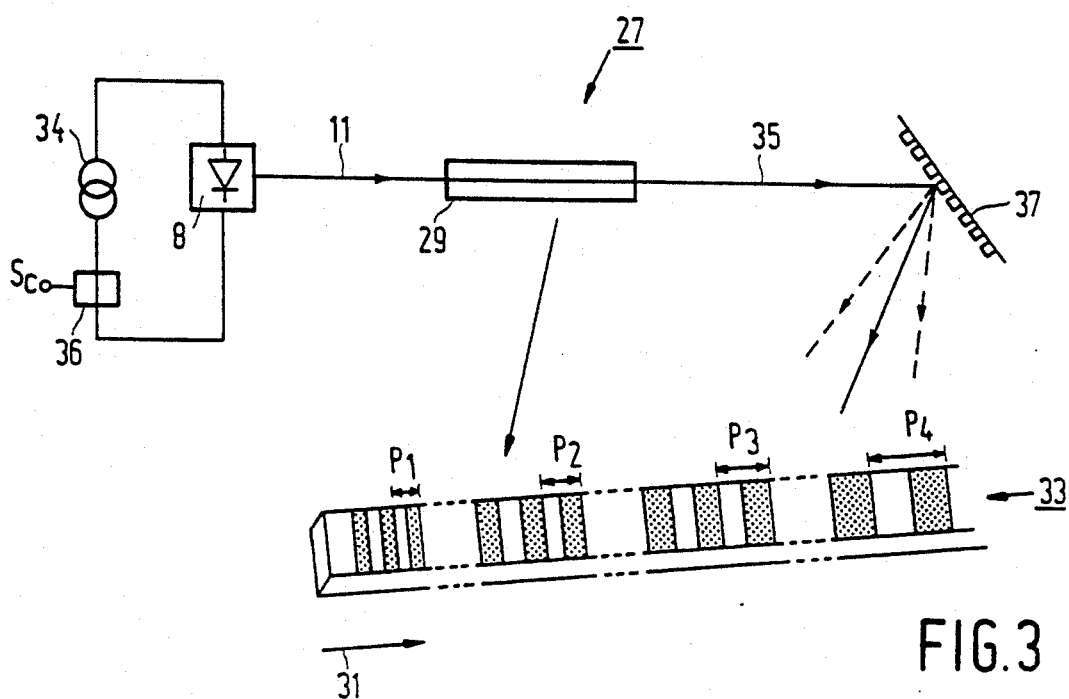
FIG. 3 shows a first embodiment of an optical device according to the invention, supplying a beam which can be deflected.

FIG. 3 shows a first embodiment of a device for supplying a stabilized laser beam in which the direction is adjustable. The feedback element of this device comprises an optical waveguide 29 with a grating 33 integrated in the direction of propagation of the radiation beam, denoted by an arrow 31, and with a varying period $P_i$.

In principle, the beam coming from the diode laser and coupled into the waveguide may be reflected in a greater or less degree by any part of the grating. As will be evident from the foregoing, only that part of the grating situated at said distance from the diode laser will influence the behaviour of the diode laser. Said part has a given grating period so that the radiation fed back into the diode laser and hence the radiation emitted by the diode laser has a given wavelength associated with this period. By adjusting, as shown in FIG. 3, the repetition frequency of the electric current source 34 by means of a circuit 36 which is driven by a control signal Sc, the delay time condition and hence the distance d can be adjusted. This means that each time a different part of the grating, each with a different period is selected for the feedback. The wavelength of the diode laser radiation can thus be varied.

The optical waveguide 29 may be implemented, for example as an optical fibre, with a planar grating being arranged in the longitudinal direction. The waveguide may also be formed as a planar optical waveguide or a channel waveguide of, for example, a semiconductor material or glass in which a planar grating is arranged in the axial direction.

The beam 35 emerging from the waveguide 29 at the wavelength stabilized by the grating is subsequently incident on a dispersive element 37. This may be, for example a prism or a grating, the grating having a better wavelength resolution than the prism. The angle at which the beam 35 will be deflected by the dispersive element 37 is dependent on the wavelength selected by the adjusted repetition frequency and the feedback grating.

Figure 4:
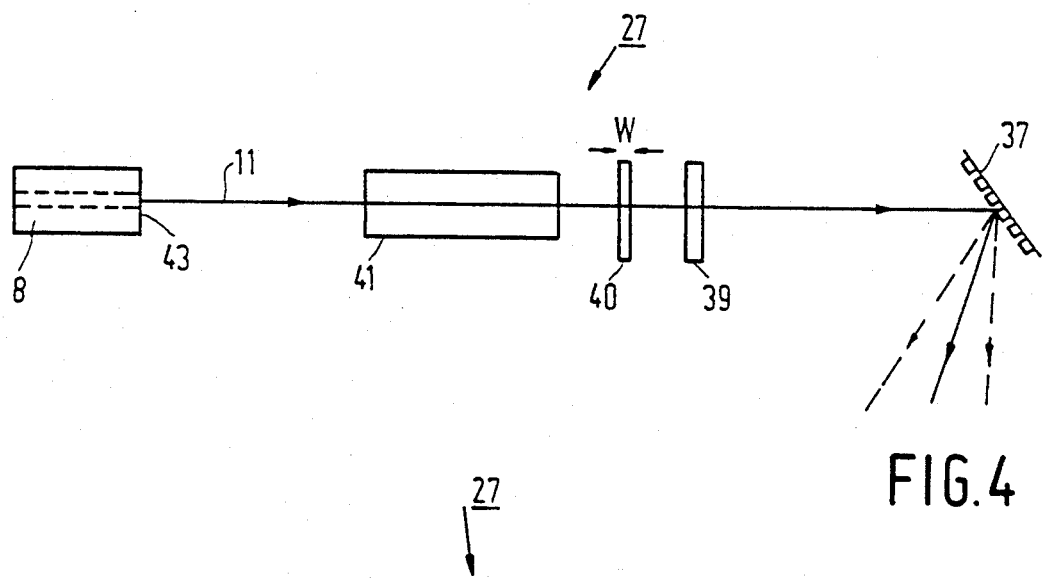
FIG. 4 shows the principle of a second embodiment of an optical device according to the invention, supplying a beam which can be deflected.

FIG. 4 shows diagrammatically a further possibility of generating a stabilized laser beam with an adjustable wavelength.

The feedback element 27 is now implemented as a reflective element having a variable reflection. The exit face 43 of the diode laser has a low reflection coefficient, for example, by providing this face with an antireflection coating. The wavelength of the output spectrum of such a diode laser is smaller than that of the output spectrum of a diode laser having an exit face with a high reflection coefficient. This is probably due to the fact that the charge carrier density in the laser resonance cavity of the first-mentioned laser is larger during laser action than in the last-mentioned laser.

Since the feedback element is arranged behind the diode laser with a higher reflection coefficient, the effective reflection coefficient for the diode lasers and hence the number of above-mentioned charge carriers is determined by the adjustable reflection coefficient of the feedback element.

Figure 5:
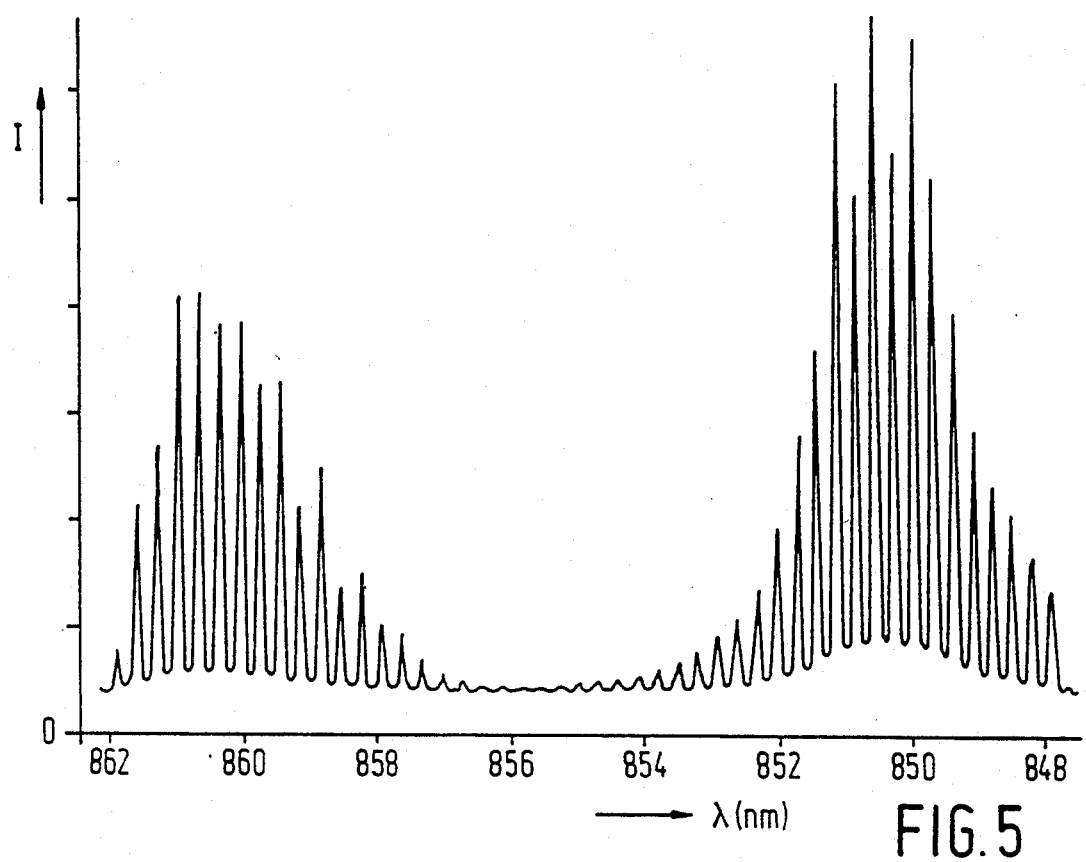
FIG. 5 shows the shift of a spectrum of a pulsed diode laser under the influence of feedback with a feedback element having a variable reflection coefficient.

For example, if a feedback element having a reflection coefficient of 0.90 is arranged behind a diode laser whose exit face has a reflection coefficient of 0.04, the spectrum of the diode laser will shift from 860 nm to 850 rim, as is shown in FIG. 5. A packet of laser modi, which packet has a width of approximately 2 nm, is situated around each of these wavelengths. Thus, when varying the reflection coefficient between 0.04 and 0.90, five wavelengths can be distinguished.

An element having an adjustable reflection coefficient can be realised by the combination of an at least partially transparent reflector 39 with a component 41 having an adjustable transmission coefficient arranged between the diode laser 8 and the reflector 39. In order that the reflected pulse returning to the laser satisfies the delay time condition, the reflector 39 should be situated at said distance d from the diode laser 8.

Figure 6:
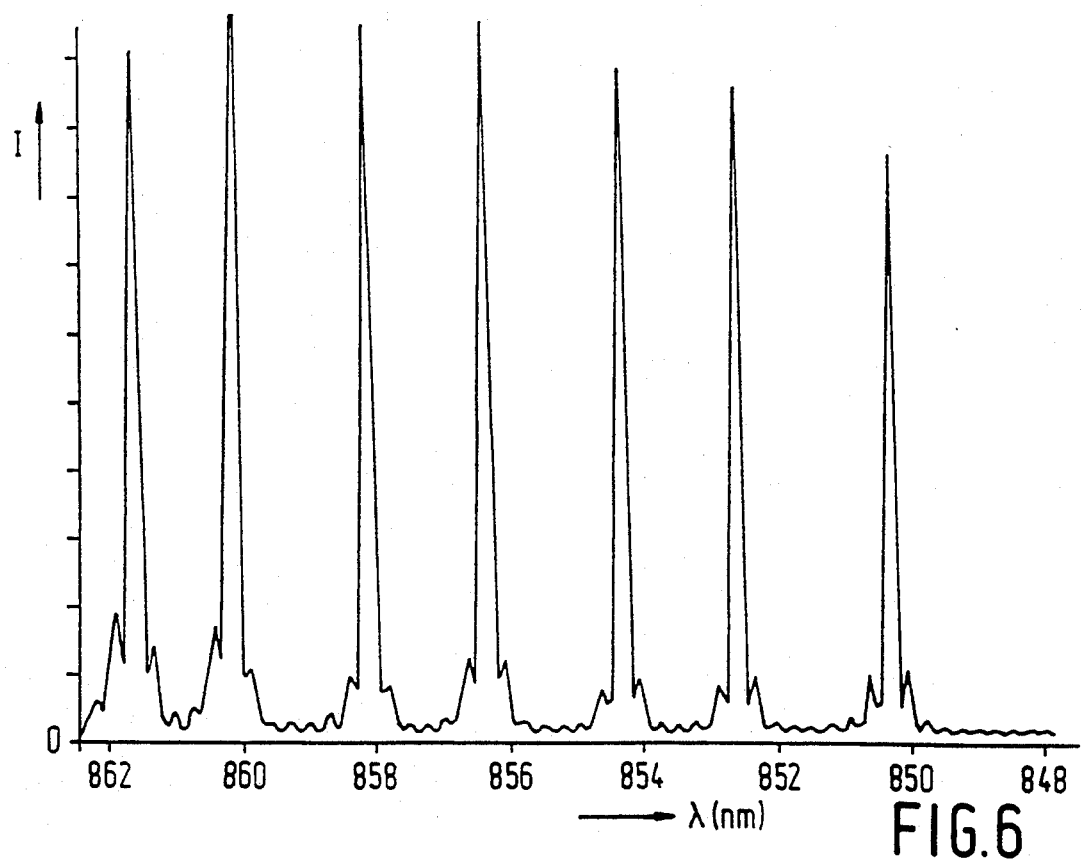
FIG. 6 shows different spectra which are obtained at different reflection coefficients, with the laser being monomode by using an etalon.

FIG. 5 shows the spectrum of a pulsed multimode diode laser. In order to increase the number of distinguishable wavelengths, an etalon, for example in the form of a plane-parallel glass plate 40 is preferably arranged in the radiation path. If the "free spectral range", i.e. the difference between two wavelengths both of which fit within the width W of the etalon is smaller than the distance between the individual laser modi, which distance is, for example 0.3 nm, the spectrum of the diode laser can be narrowed considerably. As a result it is achieved that the pulsed diode laser will behave as a monomode laser and emits only one wavelength. This is illustrated in FIG. 6 showing the different laser spectra which are obtained at different reflection coefficients R. The overall width of all spectra combined is, for example, approximately 15 rim. The number of distinguishable wavelengths is determined by the length of the diode laser resonance cavity. If this length is, for example, 1 mm and the mode distance is, for example, 0.1 rim, 150 different wavelengths can in principle be distinguished within the range of 15 nm. To be able to convert this number of wavelengths actually into as many beam directions, the grating 37 should have a separating power which is equal to or smaller than the distance between the laser modi. If this distance is 0.1 nm and the grating has 1000 periods per ram, the desired number of 150 different directions for the laser beam can be obtained with a 4 mm long grating for the second-order diffracted beam. The grating may be formed in such a way that the greater part of the radiation incident thereon is diffracted in the second order.

Instead of a transmission etalon 40 and a reflector 39, only one reflector formed as an etalon may be used. Also in the embodiments to be described hereinafter an etalon operating in reflection or not in reflection may be arranged in the radiation path so as to obtain a monomode laser beam.

Different embodiments are possible for the component 41 having an adjustable transmission coefficient.

A first possibility is to choose an electro-optical element 43 in combination with a polarization analyzer 45 for the component 41.

Figure 7:
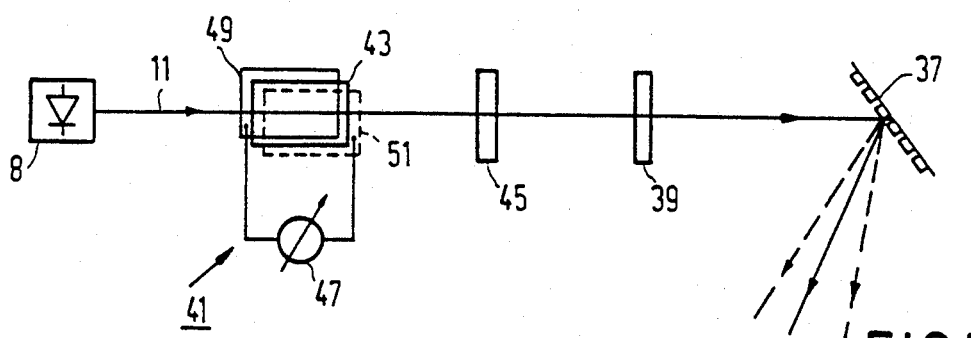
FIGS. 7 to 10 show different embodiments of an element of this device.

FIG. 7 shows an embodiment of a device according to the invention in which the electro-optical element 43 is an electro-optical crystal. With the aid of a voltage source 47 a voltage is applied across the electro-optical crystal 43 via electrodes 49, 51 arranged on the sides of the crystal. This voltage determines the birefringence of the crystal. Dependent thereon, a radiation beam passing through the crystal will undergo a change in the state of polarization. This radiation beam is subsequently incident on a polarization analyzer 45 so that the change of the state of polarization is convened into a change of intensity. By varying the voltage across the crystal 43 the intensity of the pulse reflected towards the diode laser can thus be changed. Dependent on this intensity, the diode laser will be stabilized at a different wavelength.

Figure 8:
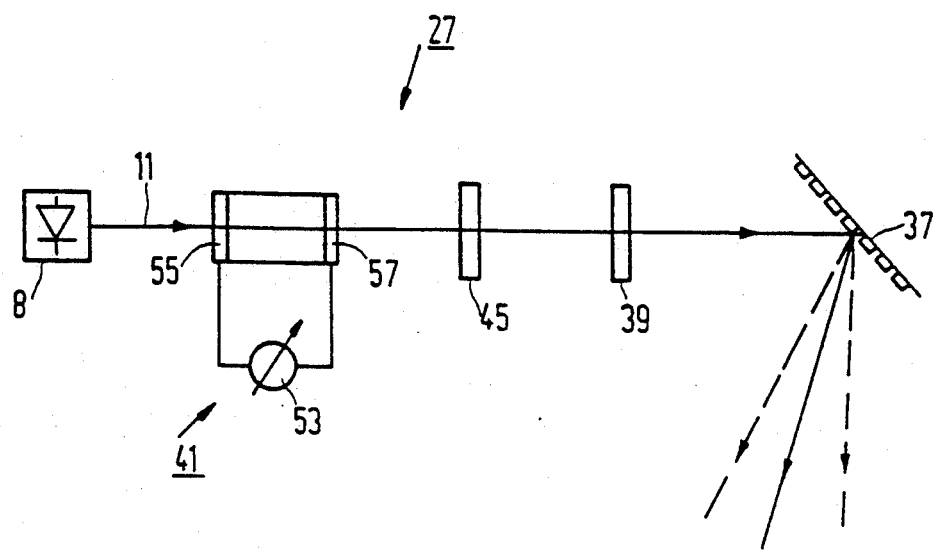

An embodiment of a device according to the invention, based on the same principle, is shown in FIG. 8 in which the electro-optical element 43 is a liquid crystalline material. Here again a voltage is applied across the material via electrodes 55, 57 by means of a voltage source 53 so that a radiation beam passing through the material undergoes a change of polarization. This change of polarization is subsequently converted into a change of intensity by the polarization analyzer 45.

Figure 9:
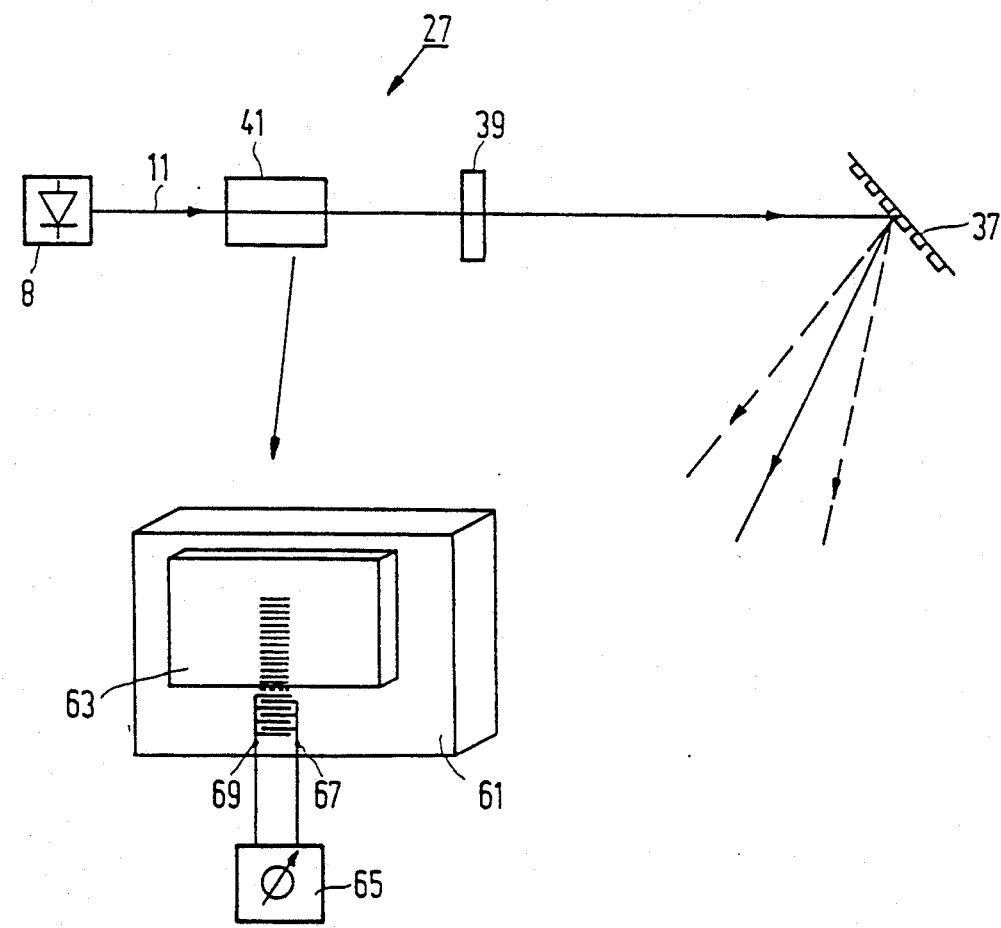

A second possibility is to choose an acousto-optical element 59 instead of an electro-optical element for the component 41. An embodiment of this element is shown in FIG. 9. In this embodiment the acousto-optical element 59 is formed from a piezoelectric substrate 61 on which an optical waveguide 63 is arranged. An acoustic wave is generated in the waveguide 63 via electrodes 67, 69 by means of a voltage source 65. This wave induces a mechanical voltage in this medium, which will give rise to periodical changes of the refractive index in the medium. In this way an optical grating is formed in the medium so that a radiation beam passing through the medium is diffracted. The angle at which diffraction takes place can be varied by varying the frequency of the voltage source and hence that of the acoustic wave. The quantity of diffracted radiation can be modulated by varying the amplitude of the acoustic wave.

The way in which diffraction takes place is dependent on the thickness of the optical waveguide 63 and the intensity of the acoustic wave. In a thin-film optical waveguide and at a relatively low intensity of the acoustic wave the incident beam is partly diffracted in only one higher order, the first order (Raman-Nath diffraction). For a thicker waveguide and an increasing intensity of the acoustic wave an incident beam is partly diffracted in different higher orders (Bragg diffraction). This means that the modulation depth for a given intensity of the acoustic wave is greatest at the Raman-Nath diffraction.

Figure 10:
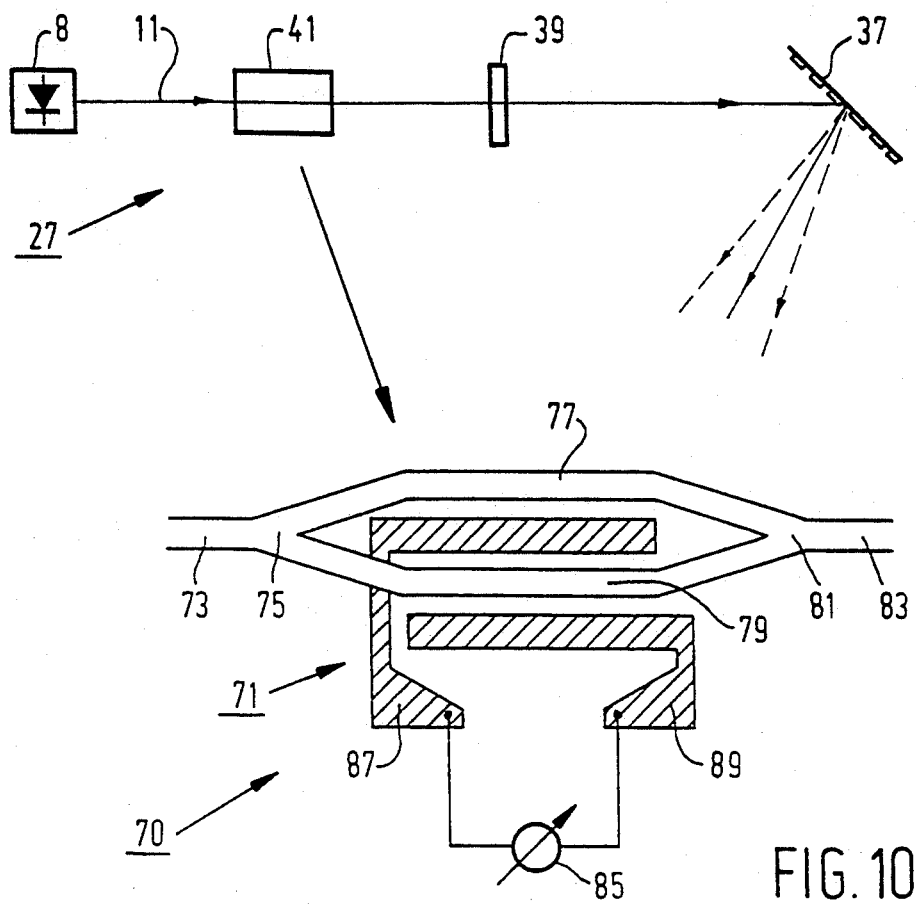
Figure 11:
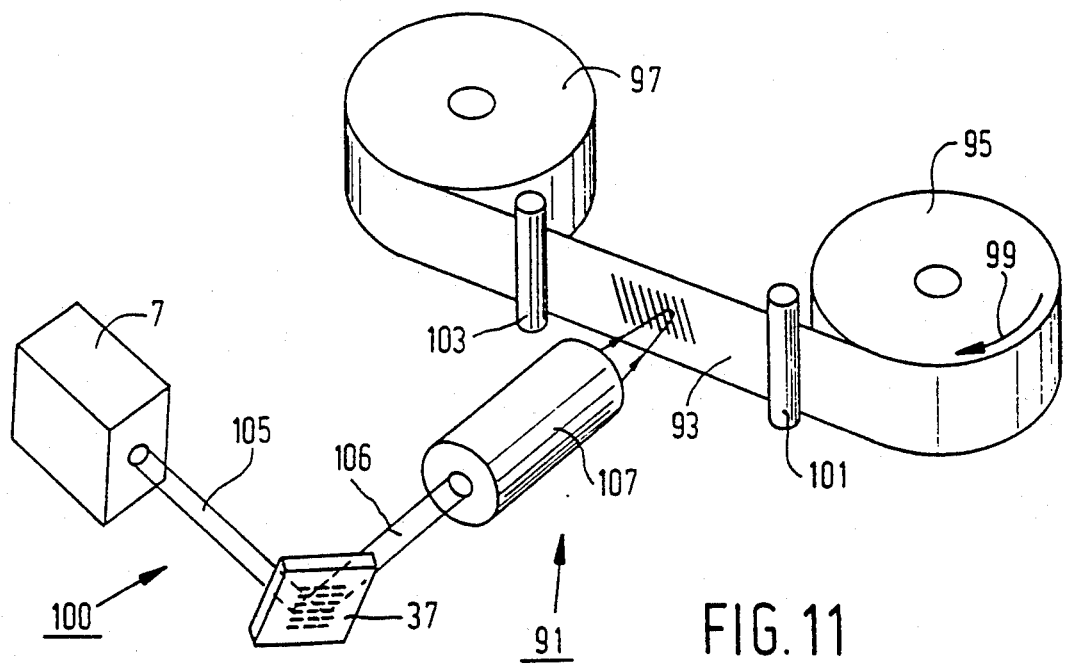
FIG. 11 shows diagrammatically an embodiment of a scanning device according to the invention for scanning a tape-shaped record carrier, FIGS. 12a, b and c show some embodiments of an optically transparent body in the form of a plane-parallel plate for folding the light path in an optical device according to the invention.

A third possibility is to form the component 41 having the adjustable transmission coefficient from a planar interferometer 70, at least one branch of which incorporates an optical phase shifter 71. An embodiment is shown in FIG. 10. Via an entrance waveguide 73 the entering beam 11 from the diode laser 8 is split up into two sub-beams at the location of the first Y junction 75, which sub-beams propagate in the two intermediate waveguides 77, 79. The two sub-beams are combined at the location of the second Y junction 81 to an outgoing beam which leaves the interferometer via the exit waveguide 83. In principle, the two intermediate waveguides are equivalent and the beam 11 at the first Y junction 75 is split up into two sub-beams having an equal amplitude and phase. The intensity of the exiting beam is then maximal. If a voltage is applied across one of the two branches via electrodes 87, 89 by means of a voltage source 85, a change of the refractive index will occur in this branch due to, for example the electro-optical effect and dependent on the material of the waveguides, resulting in a phase shift of a beam passing through this branch. The recombination of the two sub-beams in the exit waveguide will give rise to constructive or destructive interference, dependent on the relative phase shift of these beams. If desired, a voltage may also be applied (not shown) to the second branch by means of electrodes as long as the two intermediate waveguides cause a different phase shift of a sub-beam passing through them.

In this way the intensity of the radiation beam is varied by ensuring that the two sub-beams have undergone a phase shift with respect to each other after they have passed through the interferometer.

The optical device according to the invention, supplying a beam which can be deflected, can be used to great advantage in a scanning device 91 for optically scanning a tape-shaped record carder 93.

FIG. 9 shows diagrammatically an embodiment of such a scanning device. A tape-shaped record carrier 93 is transported from a first reel 95 to a second reel 97 in the tape run direction which is denoted by an arrow 99. The tape-shaped record carrier 93 is guided via capstans 101, 103. A beam 105 from the optical device 7 is diffracted by a dispersive element 37 to an objective system 107 which focuses the diffracted radiation beam 106 to a scanning spot 108 in the information plane of the record carrier. The angle at which the radiation beam 105 is diffracted is dependent on the wavelength. By varying the wavelength of the beam 105, this angle is varied so that a scanning beam is created. Each wavelength is focused at a different position on the record carrier 93. Since this variation in wavelength is realised electronically, notably electro-optically or acousto-optically, in the optical device 7, the speed at which the diffracted beam 106 is controlled is considerably higher than in the current scanning devices in which use is made of a mechanically driven polygon minor.

The optical device 100 is further also suitable for use in optical scanning apparatuses in which the record carrier is an optical disc. A recording track on such a record carrier is scanned by means of a radiation beam focused to a scanning spot. In order that the scanning spot is and remains correctly positioned with respect to the recording track, such scanning apparatuses are provided with a tracking servosystem. With this system the position of the scanning spot with respect to the track is detected and with reference thereto the position of the scanning spot is corrected. For generating the tracking signal, use can be made of a scanning spot periodically moving transversely to the track as described in U.S. Pat. No. 4,918,679. For obtaining this periodical motion, use can be made of the device according to the invention denoted by 100 in FIG. 9 if the wavelength therein is periodically varied. In order to correct the position of the scanning spot with respect to the centerline of a track to be scanned, use may also be made of the device 100 which is then controlled by a control signal derived from a tracking error signal.

A pulsed laser beam may be obtained by operating the diode laser with a periodically modulated electric current, for example a sinusoidal or pulsed current. Use may alternatively be made of a diode laser having such a structure that it supplies a pulsing beam. Such a laser, which is commonly referred to as self-pulsing laser, is known from, for example British Patent Application 2 221 094.

In addition to scanning devices for optical record carriers, discs or tapes, the invention may alternatively be used in other writing apparatuses such as laser printers and in inspection or measuring apparatuses such as scanning microscopes. The invention may generally be used in optical devices using an optical system and a diode laser as a radiation source in which feedback of radiation to the diode laser may occur due to reflections from elements of the optical system as in, for example optical telecommunication systems.

We claim:

1. An optical device comprising a diode laser for generating a radiation beam, and an optical system for concentrating and guiding the radiation beam, characterized in that the diode laser is a pulsed laser which supplies radiation pulses at a pulse duration p and a pulse period T and in that an at least partially reflecting feedback element is arranged in the radiation path of the radiation beam at approximately a distance d from the diode laser, which distance d satisfies the condition $$d = \frac{c}{2} \cdot nT - \frac{c}{2} \cdot \epsilon(p + \Delta p)$$

in which n is an integer, c is the light velocity in a medium traversed by the radiation beam, $\Delta p$ is the build-up time of a pulse PL in the diode laser and $\epsilon$ is a real number which satisfies $0 < \epsilon < 1$ and increases or decreases within these limits at a decreasing or increasing energy $E(P_r)$, respectively, of a radiation pulse reflected by the feedback element so that the condition given by $$E(P_r) > E(PL_i)$$

is satisfied at the instant when said radiation pulse enters the diode laser, $E(PL_i)$ being the radiation energy built up in the diode laser at the relevant instant.

2. An optical device as claimed in claim 1, characterized in that the feedback element is an element of the optical system.

3. An optical device as claimed in claim 1, characterized in that the feedback element is a wavelength-selective element.

4. An optical device as claimed in claim 1, characterized in that folding means for folding the radiation path are arranged between the diode laser and the feedback element.

5. An optical device as claimed in claim 4, characterized in that the folding means comprise a folding body of optically transparent material having at least two reflecting surfaces and being provided with an entrance window and an exit window, and in that one of the reflecting surfaces is provided with a third window for transmitting the diode laser radiation to and from the feedback element.

6. An optical device as claimed in claim 5, characterized in that the feedback element is integrated in the third window.

7. An optical device as claimed in claim 6, characterized in that for the purpose of changing the wavelength of the radiation reflected towards the diode laser, the folding body is rotatably arranged at a small angle with respect to the radiation beam supplied by the diode laser.

8. An optical device as claimed in claim 5, characterized in that each reflecting surface is provided with a layer having a high reflection coefficient.

9. An optical device as claimed in any one of claim 5, characterized in that the folding body is a plane-parallel plate in which the first reflecting surface and the second reflecting surface are located opposite and parallel to each other.

10. An optical device as claimed in claim 5, characterized in that the folding body is present in a medium having a refractive index which is smaller than that of the body material, in that the folding body has at least two surfaces which totally and internally reflect radiation incident thereon and in that the radiation is reflected at least once by each one of said two surfaces when it traverses a coplanar radiation path in the folding body.

11. An optical device as claimed in claim 5, characterized in that an optical prism is arranged on the entrance window and on the exit window, the surface of said prism, through which a radiation beam enters and leaves the prism, being transverse to the chief ray of the beam.

12. An optical device as claimed in claim 5, characterized in that one of the reflecting surfaces is provided with a fourth window on which a retro-directive element is arranged by which the radiation, after having traversed a first radiation path extending to the reflecting surfaces via a number of reflections, is captured in a first plane within the folding body and is reflected parallel to itself, and re-enters the body so as to traverse at least a second radiation path extending to the reflecting surfaces via a number of reflections in a plane parallel to the first plane.

13. An optical device as claimed in claim 5, characterized in that the feedback element is a grating which extends at a small angle different from 0° to the third window.

14. An optical device as claimed in claim 1, characterized in that the feedback element is a grating.

15. An optical device as claimed in claim 1, characterized in that electronic control means are provided for adjusting the wavelength of the radiation supplied by a combination of diode laser and feedback element at different discrete values.

16. An optical device as claimed in claim 15 for supplying a directionally adjustable beam, characterized in that a dispersive element is arranged behind the feedback element.

17. An optical device as claimed in claim 15, characterized in that the feedback element is constituted by an optical waveguide with a grating integrated therein, which grating has a period varying in the direction of propagation of the radiation beam, and in that the electronic control means are constituted by a frequency-adjustable periodically modulated current source for the diode laser.

18. An optical device as claimed in claim 15, characterized in that an exit face of the diode laser has a low reflection coefficient and in that the feedback element is constituted by a partially transparent reflector arranged at the distance d from the exit face of the diode laser and a component which is arranged between said reflector and the diode laser and has an adjustable transmission coefficient, and in that the electronic control means are constituted by electrodes on the component and an adjustable voltage source whose output terminals are connected to the electrodes.

19. An optical device as claimed in claim 18, characterized in that the component having the adjustable transmission coefficient is constituted by an electro-optical element succeeded by a polarization analyzer.

20. An optical device as claimed in claim 19, characterized in that the electro-optical element is a liquid crystalline material.

21. An optical device as claimed in claim 18, characterized in that the component having the adjustable transmission coefficient comprises an acousto-optical element succeeded by a polarization analyzer.

22. An optical device as claimed in claim 18, characterized in that the component having the adjustable transmission coefficient is constituted by a planar interferometer, at least one branch of which incorporates an optical phase shifter.

23. An optical device as claimed in claim 18, characterized in that an etalon is arranged in the radiation path in addition to the component having the adjustable transmission coefficient.

24. An optical device as claimed claim 1, characterized in that the diode laser is a self-pulsing diode laser.

25. An apparatus for scanning an information plane, which apparatus comprises an optical device as claimed in claim 1, for forming a scanning spot in the information plane, characterized in that with the exception of the distance between the feedback element and the diode laser, the distances of all optical elements of the optical device are unequal to said distance d.

26. An apparatus as claimed in claim 25 for scanning a tape-shaped optical record carrier in tracks, said apparatus comprising means for scanning the record carrier in a direction transverse to the tape run direction, characterized in that the means are constituted by an optical device for supplying a directionally adjustable beam, said device including a dispersive element arranged behind the feedback element, the direction of the tracks extending at an angle to the longitudinal direction of the tape provided with tape drive means for longitudinally moving the tape during scanning and beam deflection means for moving the scanning spot in the track direction.

* * * * *